United States Patent [19]
Yokoi et al.

[11] Patent Number: 6,121,174
[45] Date of Patent: Sep. 19, 2000

[54] DIELECTRIC MATERIAL WITH LOW TEMPERATURE COEFFICIENT AND HIGH QUALITY

[75] Inventors: Hitoshi Yokoi, Aichi; Hidetoshi Mizutani, Nagoya; Motohiko Sato, Inazawa; Kazushige Ohbayashi, Nagoya, all of Japan

[73] Assignee: NGK Spark Plug Co., Ltd., Nagoya, Japan

[21] Appl. No.: 08/938,158

[22] Filed: Sep. 26, 1997

[30] Foreign Application Priority Data

Sep. 26, 1996 [JP] Japan ................................. 8-277618
Jun. 24, 1997 [JP] Japan ................................. 9-184567

[51] Int. Cl.⁷ ............................ C03C 10/06; C03C 14/00
[52] U.S. Cl. ................................ 501/8; 501/10; 501/32; 428/469; 428/471
[58] Field of Search ................................ 501/8, 32, 10, 501/70; 428/469, 471

[56] References Cited

U.S. PATENT DOCUMENTS

| | | | |
|---|---|---|---|
| 4,615,987 | 10/1986 | Chyung et al. | 501/8 |
| 4,853,349 | 8/1989 | Martin | 501/8 |
| 5,023,207 | 6/1991 | MacDowell | 501/8 |
| 5,232,765 | 8/1993 | Yano et al. | 428/195 |
| 5,262,595 | 11/1993 | Yano et al. | 174/258 |
| 5,356,841 | 10/1994 | Mizutani et al. | 501/32 |
| 5,407,871 | 4/1995 | Mizutani et al. | 501/9 |
| 5,431,955 | 7/1995 | Kawamura et al. | 501/32 |
| 5,556,585 | 9/1996 | Yano et al. | 264/56 |
| 5,756,408 | 5/1998 | Terashi et al. | 501/8 |
| 5,821,181 | 10/1998 | Bethke et al. | 501/8 |

FOREIGN PATENT DOCUMENTS

| | | |
|---|---|---|
| 0 198 977 | 10/1986 | European Pat. Off. . |
| 4-82297 | 3/1992 | Japan . |
| 4-83737 | 3/1992 | Japan . |
| 404198039 | 7/1992 | Japan . |
| 4-275975 | 10/1992 | Japan . |
| 4-286181 | 10/1992 | Japan . |
| 4-292460 | 10/1992 | Japan . |
| 5-211006 | 8/1993 | Japan . |
| 6-112657 | 4/1994 | Japan . |
| 6-314916 | 11/1994 | Japan . |
| 6-338686 | 12/1994 | Japan . |
| 7-66563 | 3/1995 | Japan . |
| WO 97/37948 | 10/1997 | WIPO . |

OTHER PUBLICATIONS

Swartz, S.L. et al., "Dielectric Properties of SrTiO/sub 3/ Glass–Ceramics", *Ferroelectrics*, UK, vol. 87, ISSN 0015–0193, (1998), abstract. No Month.

*Primary Examiner*—Karl Group
*Attorney, Agent, or Firm*—Morgan, Lewis & Bockius LLP

[57] ABSTRACT

A dielectric material is disclosed which has a small absolute value of the temperature coefficient of resonance frequency and a high coefficient of unloaded quality. Also disclosed are a process for producing the dielectric material and multi-layer and other circuit boards containing the dielectric material. The dielectric material is a highly densified material having a water absorption lower than 0.1%, which is obtained by mixing 95.5 to 99.5 percent by weight mixture of a glass frit and a strontium compound with 0.5 to 4.5 percent by weight titanium dioxide, compacting the resultant mixture, and sintering the compact at a relatively low temperature around 930° C. This dielectric material is a glass ceramic containing strontium anorthite ($SrAl_2Si_2O_8$) as the main crystalline phase, and may contain the $TiO_2$, which remains unchanged after sintering. The absolute value of the temperature coefficient of resonance frequency of the dielectric material is 20 ppm/° C. or lower, preferably 10 ppm/° C. or lower, more preferably 5 ppm/° C. or lower. The product of the unloaded quality coefficient and resonance frequency is 1,800 GHz or larger, preferably 2,500 GHz or larger. This material therefore has excellent dielectric properties.

26 Claims, 3 Drawing Sheets

DIELECTRIC MATERIAL WITH LOW TEMPERATURE COEFFICIENT AND HIGH QUALITY

BACKGROUND OF THE INVENTION

This application claims the benefit of Application No. Hei.8-277618, filed in Japan on Sep. 26, 1996, and Application No. Hei. 9-184567, filed in Japan on Jun. 24, 1997, both of which are incorporated by reference.

FIELD OF THE INVENTION

The present invention relates to a field of dielectric materials having excellent dielectric properties in the microwave range. The present invention also relates to a process for producing the dielectric material. The present invention further relates to single and multi-layer circuit boards, which are obtained by forming a wiring pattern made of a conductive material, either on a surface of a substrate consisting of the dielectric material or between stacked substrates consisting of the dielectric material. The invention also relates to other devices used in such applications such as dielectric resonators and filters, particularly those operating in the microwave range.

DISCUSSION OF RELATED ART

Multilayer circuit boards presently are obtained by sintering insulator layers at a low temperature around 900° C. The layers are typically comprised of an inorganic filler, e.g., aluminum oxide ($Al_2O_3$) or titanium dioxide ($TiO_2$), and a glass ingredient. This kind of multilayer circuit board is obtained by forming a pattern of a highly conductive material, e.g., gold, silver, or copper, on an unsintered substrate by printing, stacking such printed substrates, and then sintering the stacked substrates simultaneously with the conductor at a low temperature. These circuit boards are used as layer-built dielectric resonators, filters, or other microwave devices, with the conductors serving as internal electrodes.

Dielectric materials used as components of such multilayer circuit boards or other devices described above must satisfy the following requirements:

(i) the absolute value of the temperature coefficient of resonance frequency (hereinafter referred to as $\tau_f$ of $f_0$) must be low; and (ii) the coefficient of unloaded quality (hereinafter referred to as $Q_u$) must be high in the microwave range.

Borosilicate glasses, aluminosilicate glasses, and others are frequently used as the glass ingredient for forming insulator layers. However, the substrate materials obtained from these glass ingredients and those obtained from mixtures of these glass ingredients with $Al_2O_3$ as an inorganic filler have a large negative value of $\tau_f$ and hence have a large temperature dependence of resonance frequency. These prior art substrate materials are therefore undesirable for use in resonators or filters.

A technique for correcting the $\tau_f$ of such a base material has been proposed. That technique includes adding an inorganic filler having a large positive value of $\tau_f$, such as $TiO_2$, $CaTiO_3$, or $SrTiO_3$.

However, these inorganic fillers tend to react with glass ingredients or dielectric materials that include glass ingredients and $Al_2O_3$ added thereto during the sintering process. They may also react with wiring materials, thick resistor films, or other components formed on the surface of the dielectric material. This reaction may thus change the properties of components, e.g., a thick resistor film, present on a surface of the dielectric substrate. Use of those inorganic fillers also has another problem in that they react with a glass frit to form a solid solution, thus forming a disordered crystal structure, and making it impossible to obtain the expected effect of correcting $\tau_f$. If those inorganic fillers are added in large amounts, or if those inorganic fillers having a large particle diameter are added, two problems occur: (i) a homogeneous dielectric material is difficult to obtain, and (ii) a sufficiently densified sinter is difficult to obtain through low-temperature sintering.

No effective means have been proposed for improving the $Q_u$ of a dielectric material produced through low-temperature sintering. Consequently, the product of the unloaded quality coefficient and resonance frequency of any dielectric material currently in use is about 1,000 GHz, at the most.

In the description and claims that follow, the term "strontium anorthite" ($SrAl_2Si_2O_8$; hereinafter referred to as "Sr anorthite") refers to the anorthite ($CaAl_2Si_2O_8$) in which the calcium has been replaced with strontium. The term "main crystalline phase", used to refer to a crystalline phase in a sinter, is defined as the crystalline phase that gives the highest integrated intensity when the sinter obtained through sintering is pulverized and analyzed by X-ray powder diffractometry for crystal phase identification. The term "glass ceramic" refers to a composite material obtained by sintering a mixture of a glass and crystal grains comprising an inorganic filler. The term "crystallized glass" refers to a glass including an amorphous phase and one or more crystalline phases, where Sr anorthite is the main crystalline phase.

SUMMARY OF THE INVENTION

Accordingly, the present invention is directed to a dielectric material having a low temperature coefficient of resonance frequency and a high unloaded quality, a process for producing such dielectric material, and a single or multi-layer circuit board containing such dielectric material that substantially obviates one or more of the problems described above due to the limitations and disadvantages of related art.

An object of the present invention is to provide a dielectric material that has an absolute $\tau_f$ value of 20 or less, has a product of the $Q_u$ and $f_0$, i.e., $Q_u \times f_0$, of 1,800 GHz or larger, preferably 2,500 GHz or larger, and is a homogeneous dense sinter even when obtained through low-temperature sintering.

Another object of the present invention is to provide a process for producing the dielectric material described above.

Another object of the present invention is to provide a single or multi-layer circuit board containing the dielectric material.

In accordance with one aspect of the present invention there is provided a glass ceramic dielectric material that includes strontium anorthite ($SrAl_2Si_2O_8$) as the main crystalline phase.

In accordance with another aspect of the present invention, there is provided a dielectric material including between 95.5 and 99.5 percent by weight crystallized glass containing strontium anorthite ($SrAl_2Si_2O_8$) as the main crystalline phase and between 0.5 and 4.5 percent by weight titanium oxide ($TiO_2$).

In accordance with another aspect of the present invention, there is provided a process for producing a dielectric material composed of the steps of:

(a) mixing between 95.5 and 99.5 percent by weight mixture including a glass frit and a strontium compound with between 0.5 and 4.5 percent by weight $TiO_2$;

(b) compacting the resultant mixture to produce a compact;

(c) sintering the compact at a temperature of between 850 and 1,000° C. in order to densify the compact until the compact attains a water absorption lower than 0.1 percent;

(d) simultaneously reacting the glass frit with the strontium compound to yield strontium anorthite as a main crystalline phase.

It is to be understood that both the foregoing general description and the following detailed description are exemplary and explanatory and are intended to provide further explanation of the invention as claimed.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

BRIEF DESCRIPTION OF THE DRAWINGS

The accompanying drawings, which are included to provide a further understanding of the invention and are incorporated in and constitute part of this specification, illustrate embodiments of the invention and together with the description serve to explain the principles of the invention.

In the drawings.

DETAILED DESCRIPTION OF THE PREFERRED EMBODIMENTS

EXPERIMENTAL RESULTS

Figure 1:
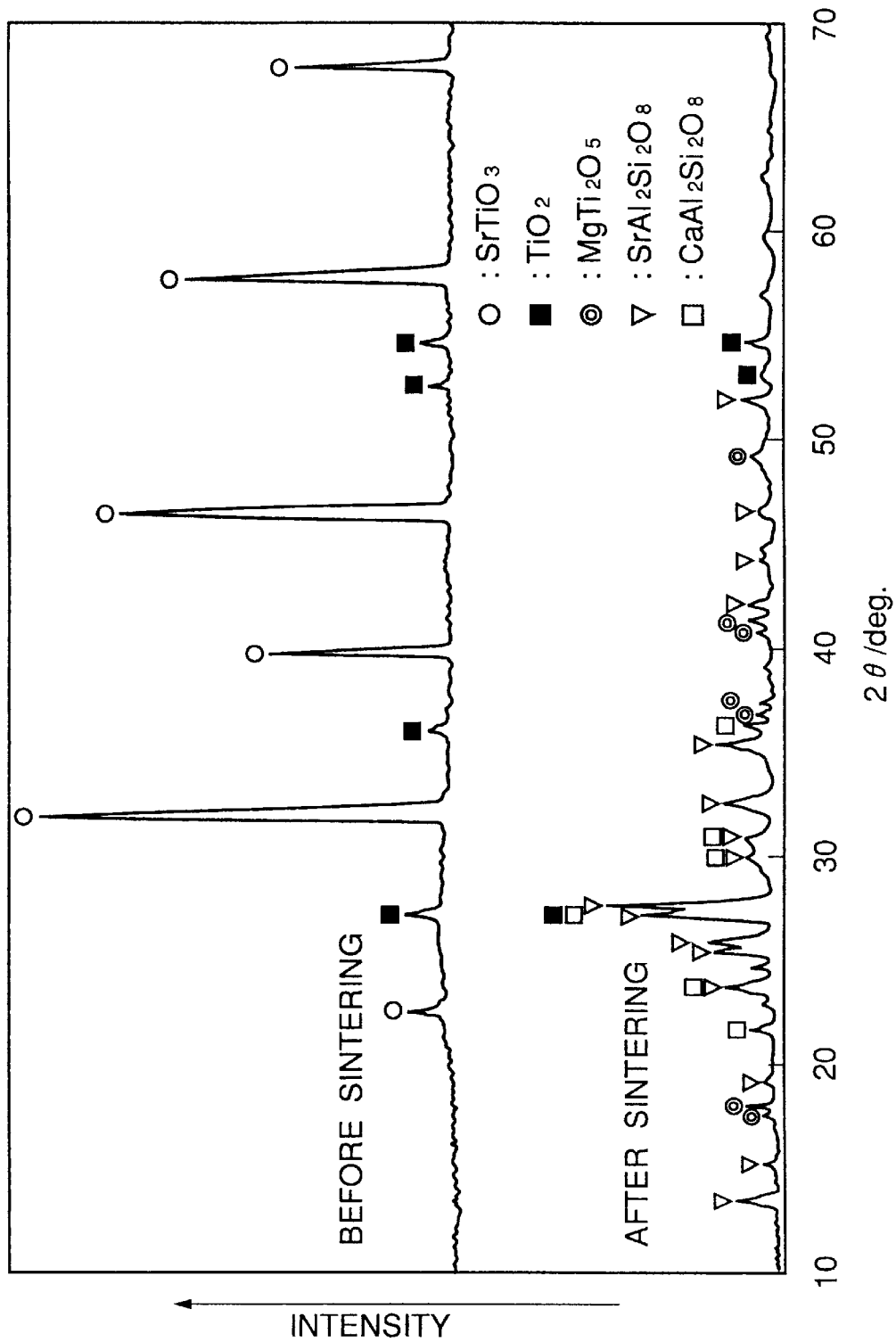
FIG. 1 is a graphic presentation illustrating a comparison in X-ray diffraction pattern between the dielectric material obtained through sintering in one experimental sample, and the unsintered compact from which the dielectric material was obtained.

Before discussing the details of the preferred embodiments of the present invention, the understanding of the present invention will be aided by reference to Experimental Examples described below and illustrated in Table 1 and Table 2. It is to be understood that the invention should not be construed as being limited to these Experimental Examples.

EXPERIMENTAL EXAMPLES 1 TO 14

Glass-forming ingredients, each in a powder form, were mixed with each other in the proportions shown in

TABLE 1

| Experimental Example | Glass Frit Components Composition (percent by weight) | | | | | | Amount (percent by weight) | Strontium Compound Compound | Amount (percent by weight) | Particle diameter (μm) | Inorganic Filler Used in Combination Compound | Amount (percent by weight) | Dielectric Properties $\epsilon_r$ | $Q_u \times f_0$ (GHz) | $\tau_f$ (ppm/°C.) | Main Crystalline Phase |
|---|---|---|---|---|---|---|---|---|---|---|---|---|---|---|---|---|
| | $SiO_2$ | $Al_2O_3$ | MgO | $B_2O_3$ | CaO | $ZrO_2$ | | | | | | | | | | |
| Inventive Materials | | | | | | | | | | | | | | | | |
| 1 | 44.0 | 33.0 | 12.0 | 4.5 | 4.5 | 2.0 | 67.9 | $SrTiO_3$ | 31.5 | 0.9 | $TiO_2$ | 0.6 | 9.0 | 3200 | −18.2 | $SrAl_2Si_2O_8$ |
| 2 | 43.0 | 28.0 | 12.0 | 8.0 | 8.0 | 1.0 | 68.2 | | 29.1 | 0.9 | | 2.7 | 9.5 | 2900 | −3.7 | |
| 3 | 43.0 | 28.0 | 12.0 | 8.0 | 8.0 | 1.0 | 65.6 | $SrSnO_3$ | 30.0 | 1.1 | | 4.4 | 8.2 | 2320 | −18.4 | |
| 4 | 43.0 | 28.0 | 12.0 | 8.0 | 8.0 | 1.0 | 68.4 | $SrTiO_3$ | 27.6 | 1.7 | | 4.0 | 9.9 | 2910 | +7.1 | |
| 5 | 42.0 | 33.0 | 11.0 | 6.0 | 6.0 | 2.0 | 70.0 | $Sr_3Ti_2O_7$ | 25.5 | 1.2 | | 4.5 | 10.1 | 2840 | +11.3 | |
| 6 | 43.0 | 31.0 | 11.0 | 7.0 | 7.0 | 1.0 | 74.9 | $Sr_2TiO_4$ | 23.6 | 1.5 | | 1.5 | 9.2 | 3020 | −4.4 | |
| 7 | 45.0 | 29.0 | 11.0 | 7.0 | 7.0 | 1.0 | 79.0 | $SrTiO_3$ | 18.0 | 1.8 | | 3.0 | 9.7 | 2940 | +5.6 | |
| 8 | 45.0 | 30.0 | 11.0 | 7.0 | 7.0 | 0.0 | 72.5 | | 26.4 | 1.2 | | 1.1 | 9.8 | 2790 | −7.4 | |
| Comparative Materials | | | | | | | | | | | | | | | | |
| 9 | 43.0 | 28.0 | 12.0 | 8.0 | 8.0 | 1.0 | 67.8 | $SrTiO_3$ | 32.2 | 1.7 | $TiO_2$ | 0.0 | 8.8 | 3070 | −31.6 | $SrAl_2Si_2O_8$ |
| 10 | 43.0 | 28.0 | 12.0 | 8.0 | 8.0 | 1.0 | 67.8 | | 32.2 | 9.8 | | 0.0 | 11.7 | 2200 | +99.4 | $SrTiO_3$ |
| 11 | 43.0 | 28.0 | 12.0 | 8.0 | 8.0 | 1.0 | 95.0 | | 5.0 | 9.8 | | 0.0 | 8.2 | 1470 | −9.8 | |
| 12 | 50.0 | 30.0 | 13.0 | 3.0 | 3.0 | 1.0 | 67.9 | | 26.7 | 1.7 | | 5.4 | 10.4 | 2430 | +20.9 | $SrAl_2Si_2O_8$ |
| 13 | 50.0 | 30.0 | 13.0 | 3.0 | 3.0 | 1.0 | 69.4 | | 19.7 | 1.7 | $Al_2O_3$ | 10.9 | 11.1 | 2360 | +40.3 | |
| 14 | 43.0 | 28.0 | 12.0 | 8.0 | 8.0 | 1.0 | 68.3 | | 29.2 | 1.7 | | 2.5 | 8.7 | 3100 | −32.9 | |

The mixture was melted at 1,500° C., and the melt was maintained at that temperature for 2 hours and then poured into water to obtain a glass. This glass was pulverized by a wet process and dried to obtain a glass powder having an average particle diameter of about 1 μm. To this glass powder were added a Sr compound having the particle diameter shown in Table 1 and $TiO_2$ having an average particle diameter of 1.9 μm, according to the formulation shown in Table 1. These powder ingredients were mixed in ethanol and then dried. A resin ingredient (ethyl methacrylate) was added thereto as a compaction aid, and the resultant powder mixture was granulated. The granules were molded at a pressure of 8 GPa into a cylindrical form having a diameter of 23 mm and a thickness of 12 mm. In Experimental Example 14, $Al_2O_3$ having an average particle diameter of 1 μm was used in place of $TiO_2$.

The cylindrical compact obtained above was subjected to isostatic pressing (CIP) at a pressure of 15 GPa, and then sintered for 0.5 hours in the air at a temperature of 930° C. After the dielectric material thus obtained was polished, it was examined for relative permittivity ($\in_r$) $Q_u$ and $\tau_f$ (temperature range: 25–80° C.) using Hakki and Coleman's method at a frequency of 5 to 8 GHz. For ascertaining the main crystalline phase, the test piece used for the dielectric property examination was pulverized and analyzed by X-ray powder diffractometry. The results obtained are shown in Table 1.

In Hakki and Coleman's method (Denish C. Dube, Rudolf Zurmuhien, Andrew Bell and Nava Setter, "Dielectric Measurements on High-Q Ceramics in Microwave Resion", *J. Am. Ceram. Soc.*, 80[5] 1095–1100 (1997)), a dielectric specimen is short-circuited (touched) by the two conducting plates on both sides. Two small antennas are positioned in the vicinity of the specimen to couple power in and out of the resonator.

In Table 1, the results concerning dielectric loss properties are given in terms of $Q_u \times f_0$. Since $f_0$, which is the resonance frequency used for determining $Q_u$, varies slightly with the measurement for determining $Q_u$, the product of $Q_u$ and $f_0$ is used for more precisely expressing the dielectric loss. The water absorptions of the dielectric materials obtained in Experimental Examples 1 to 14 were measured in accordance with JIS C2141. As a result, the water absorptions in each was below 0.1%.

The results given in Table 1 show the following. The dielectric materials obtained in Experimental Examples 1 to 7, in which 65.6–79.0 percent by weight glass-forming ingredients and 31.5–18.0 percent by weight Sr compound were used in combination with 0.6–4.5 percent by weight $TiO_2$, had $\tau_f$ values of between −18.4 and +11.3 ppm/° C. The dielectric materials obtained using $SrTiO_3$ as a Sr compound had $Q_u \times f_0$ values of between 2,840 and 3,200 GHz, while that obtained using $SrSnO_3$ as a Sr compound had a $Q_u \times f_0$ of 2,320 GHz. Thus, the dielectric materials produced in Experimental Examples 1 to 7 showed exceedingly high dielectric properties. The strontium titanate and strontium stannate used in these Experimental Examples did not remain as they were. It is thought that the yielded Sr anorthite served to greatly improve $Q_u \times f_0$ and the $TiO_2$ functioned to correct $\tau_f$ so as to shift it to the positive side and regulate it to a value in the preferred range specified hereinabove. On the other hand, the dielectric material obtained in Experimental Example 8 using a glass frit not containing $ZrO_2$, which is thought to function to form crystal nuclei, had a slightly smaller value of $Q_u \times f_0$ than the dielectric materials obtained in Experimental Examples 1, 2, and 4 to 7 using a titanate as a Sr compound. However, the dielectric material obtained in Experimental Example 8 had excellent dielectric properties almost equal to those of the other dielectric materials.

The values of $\tau_f$ varied from −18.2 ppm/° C. for the dielectric material obtained in Experimental Example 1, in which the $TiO_2$ amount was as small as 0.6% by weight, to +11.3 ppm/° C. for the dielectric material obtained in Experimental Example 5, in which the $TiO_2$ amount was 4.5% by weight, which is the upper limit. In particular, the dielectric materials in which the proportions of $TiO_2$ were 3.0% by weight and 4.0% by weight, respectively, each had an absolute $\tau_f$ value not larger than 10.0 ppm/° C. Furthermore, the dielectric materials which had been produced using $SrTiO_3$ as a Sr compound and in which the proportions of $TiO_2$ were 1.5% by weight and 2.7% by weight, respectively, each had exceedingly high performances with an absolute $\tau_f$ value not larger than 5.0 ppm/° C. Although the dielectric materials obtained in Experimental Examples 1 to 8 differed in dielectric properties, the dielectric material of Experimental Example 2 was especially superior in comprehensive properties, i.e., in a balance among $\in_r$, $Q_u \times f_0$, and $\tau_f$. Although the dielectric material obtained in Experimental Example 3 using $SrSnO_3$ as a Sr compound had a $\tau_f$ value shifted to the negative side, it had excellent performances like the other dielectric materials.

FIG. 1 shows a comparison in X-ray diffraction patterns between the dielectric material obtained through sintering in Experimental Example 2 and the corresponding unsintered compact. FIG. 1 shows that the diffraction pattern of the unsintered compact had only the peaks assignable to $SrTiO_3$ and $TiO_2$. In contrast, the diffraction pattern of the dielectric material obtained through sintering had no peaks assignable to $SrTiO_3$, and the main peaks were assignable to $SrAl_2Si_2O_8$. The diffraction pattern also indicates that $MgTi_2O_5$ had generated. Moreover, the peaks assignable to $TiO_2$ remained unchanged in the diffraction pattern. This means that the $TiO_2$ remained as it was after sintering.

On the other hand, in the dielectric material obtained in Experimental Example 9 without using $TiO_2$ as an inorganic filler, the correction of $\tau_f$ to the positive side was insufficient, and the dielectric material had a large negative value of $\tau_f$. In the dielectric material obtained in Experimental Example 10 without using $TiO_2$, as in Experimental Example 9, the main crystalline phase was constituted of $SrTiO_3$, since the change of $SrTiO_3$ into Sr anorthite had not proceeded because of the large $SrTiO_3$ particle diameter of 9.8 μm. Consequently, the dielectric material obtained in Experimental Example 10 had an insufficiently improved $Q_u \times f_0$ value and an exceedingly large positive value of $\tau_f$. In the dielectric material obtained in Experimental Example 11, which was the same as Experimental Example 10 except that the additional amount of $SrTiO_3$ was reduced to 5.0% by weight, the main crystalline phase was constituted of residual $SrTiO_3$ as in the dielectric material of Experimental Example 10. Although the dielectric material of Experimental Example 11 had a moderately corrected excellent value of $\tau_f$ because of the small addition amount of $SrTiO_3$, it had an even smaller value of $Q_u \times f_0$, which is below the desired value of 1800 GHz.

In the dielectric material obtained in Experimental Example 12, in which $TiO_2$ was used in an amount of 5.4% by weight, the improvement of $Q_u \times f_0$ by Sr anorthite was somewhat insufficient and the value of $\tau_f$ was slightly larger than +20 ppm/° C. The dielectric material obtained in Experimental Example 13, in which $TiO_2$ was added in an amount far larger than the upper limit, had an even smaller value of $Q_u \times f_0$ and a large positive value of $\tau_f$. The dielectric material obtained in Experimental Example 14, in which $Al_2O_3$ was used as the inorganic filler other than Sr compounds, had a small value of $\epsilon_r$ and a large negative value of $\tau_f$.

EXPERIMENTAL EXAMPLES 15 TO 18

Using the same starting ingredients in the same proportion as in Experimental Example 2, dielectric materials were produced under the same conditions as in Experimental Example 2, except that sintering was conducted at the temperatures shown in Table 2. The dielectric materials thus obtained were evaluated for dielectric properties and examined for the component constituting the main crystalline phase, in the same manner as in Experimental Example 2. The results obtained are shown in ficiently and the degree of densification was low. The dielectric materials thus obtained in Experimental Examples 17 and 18 therefore had water absorptions as high as 0.5% and 2.0%, respectively, which exceed the desired upper limit of 0.1%. The dielectric material obtained in Experimental Example 18 had an exceedingly high dielectric loss and gave no resonance waveform.

EXPERIMENTAL EXAMPLE 19

A glass ingredient prepared using the same starting ingredients in the same proportion as in Experimental Example 2 shown in Table 1 was mixed with the same powdery Sr compound and additive as in Experimental Example 2. These ingredients were mixed in ethanol and dried in the same manner as in Experimental Example 2. To this powder

TABLE 2

| Experimental Example | Burning Temperature (° C.) | Water Absorption (%) | $\epsilon_r$ | $Q_u \times f_0$ (GHz) | $\tau_f$ (ppm/° C.) | Main Crystalline Phase |
|---|---|---|---|---|---|---|
| Inventive Materials | | | | | | |
| 15 | 900 | <0.1 | 10.1 | 2510 | +15.2 | $SrAl_2Si_2O_8$ |
| 16 | 950 | <0.1 | 9.5 | 3010 | +1.9 | |
| Comparative Materials | | | | | | |
| 17 | 830 | 0.5 | 9.8 | 1620 | +82.5 | $SrTiO_3$ |
| 18 | 800 | 2.0 | unable to be determined | | | |

As noted, the dielectric material obtained in Experimental Example 18 had an exceedingly high dielectric loss and gave no resonance waveform; therefore, the dielectric properties of this Experimental Example could not be determined, as stated in Table 2.

The results given in Table 2 show the following. The dielectric materials obtained in Experimental Examples 15 and 16, respectively using sintering temperatures of 900° C. and 950° C., each had a water absorption lower than 0.1%, and had $\tau_f$ values of +15.2 ppm/° C. and +1.9 ppm/° C., respectively, and $Q_u \times f_0$ values of 2,510 GHz and 3,010 GHz, respectively; thus these dielectric materials had excellent performances. A comparison between these values and the results for the dielectric material obtained in Experimental Example 2 using a sintering temperature of 930° C. illustrates that the absolute $\tau_f$ value of the dielectric material obtained through sintering at 950° C. was close to that of the dielectric material of Experimental Example 2, while the dielectric material obtained through sintering at 900° C. had a considerably large absolute value of $\tau_f$ probably because of a large amount of residual $SrTiO_3$. On the other hand, the $Q_u \times f_0$ value of the dielectric material obtained through sintering at 950° C. also was close to that of the dielectric material of Experimental Example 2, while the dielectric material obtained through sintering at 900° C. had a small $Q_u \times f_0$ value, probably because of the insufficient generation of Sr anorthite. These results support the especially preferred sintering temperature range of between 930 and 950° C.

On the other hand, in Experimental Examples 17 and 18, in which sintering was conducted at temperatures lower than 850° C., the conversion of $SrTiO_3$ into Sr anorthite did not proceed and the resultant main crystalline phase was hence constituted of $SrTiO_3$. In addition, since sintering was conducted at low temperatures, sintering did not proceed sufmixture were added an acrylic binder (ethyl methacrylate), a plasticizer (dioctyl phthalate), and a dispersant (a polymer partly esterified with maleic acid). These ingredients were sufficiently mixed in a toluene/methyl ethyl ketone mixed solvent to prepare a slurry. Subsequently, green tapes having predetermined thicknesses ranging between 0.1 and 1.2 mm were formed from the slurry by doctor blade method.

Figure 2:
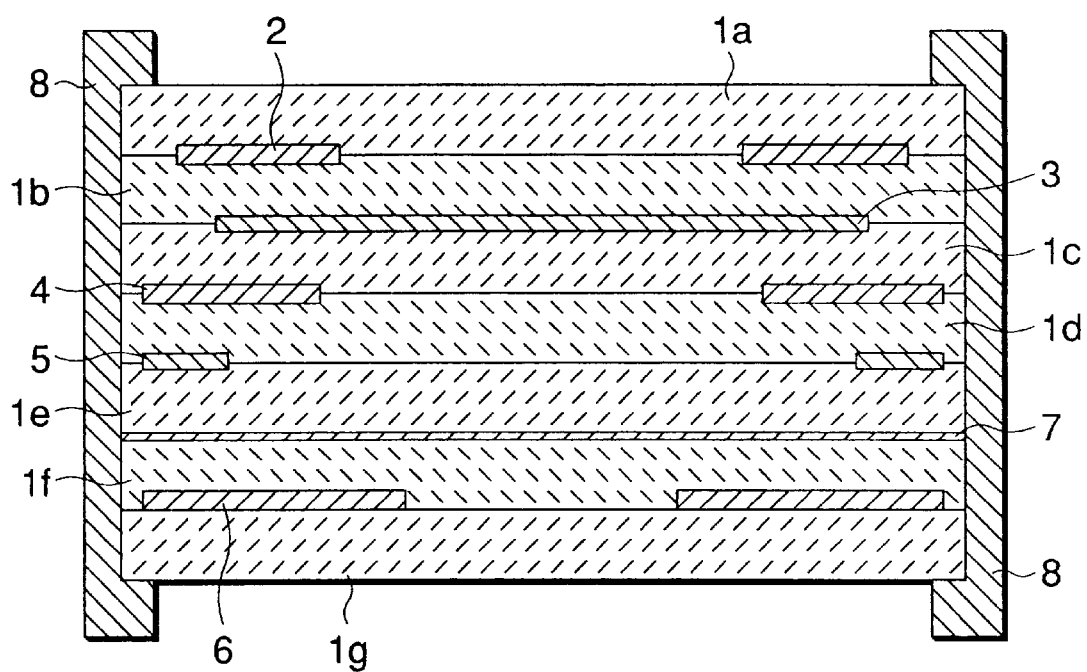
FIG. 2 is a vertical sectional view of the multilayer circuit board fabricated in another experimental sample.

Using a silver paste for use in the formation of thick circuit films, conductor wiring patterns (thickness: 20–25 $\mu$m) were formed by printing on the green tapes having various thicknesses in the above range, in order to form various electrodes such as those shown in FIG. 2. Thereafter, the green tapes bearing the printed conductor patterns were stacked in a predetermined sequence. The stacked tapes were pressed at a temperature of 50° C. and a pressure of 1 GPa to form a single multilayer structure. Subsequently, the resultant multilayered structure was heated to 250° C. to decompose and remove the binder and the other volatile ingredients, and then sintered at 930° C. for 0.5 hours. External electrodes, etc. were further formed on the upper and lower surfaces and on the side of the sintered structure using a silver/platinum paste or a silver/palladium paste. Thus, a multilayer circuit board was obtained that had the vertical sectional structure shown in FIG. 2. This is further described in the embodiments below.

The main crystalline phase in this multilayer circuit board was separately ascertained using a multilayered sintered structure formed under the same conditions except that the printing for forming conductor wiring patterns, etc. was omitted. The sintered structure was subsequently pulverized, and then analyzed by the same technique of X-ray powder diffractometry. As a result, the main crystalline phase was found to be constituted of Sr anorthite like that in Experimental Example 2.

It is further noted that it is possible to mix a glass frit with Sr anorthite synthesized beforehand. Also, the Sr anorthite, constituting the main crystalline phase, not only functions to correct $\tau_f$ so as to shift it to the positive side, but also effectively improves $Q_u$. However, when strontium titanate was used as a Sr compound, the magnesium titanate ($MgTi_2O_5$) yielded together with Sr anorthite had a negative value of $\tau_f$. Consequently, if the additional amount of a strontium titanate is not less than about 25% by weight based on the dielectric material, the resultant dielectric material has a $\tau_f$ value shifted to the negative side rather than to the positive side. In the present invention, an inorganic filler having a positive value of $\tau_f$, in particular $TiO_2$, is used in several of the embodiments described below, in an appropriate amount in combination with the feedstock, in order to inhibit the shift of $\tau_f$ to the negative side and obtain an absolute $\tau_f$ value close to 0.

DESCRIPTION OF PREFERRED EMBODIMENTS

Referring now to the figures, the background of the present invention, and the experimental examples described above, the embodiments of the invention will now be described.

In the first embodiment of the present invention, there is provided a glass ceramic dielectric material, where the glass ceramic has strontium anorthite as a main crystalline phase.

In the second embodiment of the present invention, there is provided a dielectric material as described above in the first embodiment, such that the dielectric material may have $TiO_2$ as another crystalline phase.

It is noted with respect to the first and second embodiments that the dielectric materials have a small absolute value of $\tau_f$, a large value of $Q_u \times f_0$, and a high density. Since these dielectric materials can be produced though low-temperature sintering, wiring patterns comprising a conductor, e.g., gold or silver, printed on green tapes from which the dielectric materials are to be obtained, can be sintered simultaneously with the green tapes.

In the third embodiment of the present invention, there is provided a dielectric material, that material including between 95.5 and 99.5 percent by weight crystallized glass, which in turn includes strontium anorthite as a main crystalline phase, that dielectric material also including between 0.5 and 4.5 percent by weight $TiO_2$.

It is noted with respect to the third embodiment and other embodiments referring to $TiO_2$, that the $TiO_2$ is not limited in its the crystal structure, and may have any crystal structure, such as, e.g., rutile, which is one of the common crystal structures. The $TiO_2$ retains its original crystal structure after sintering. This $TiO_2$ not only functions to correct $\tau_f$ by shifting it to the positive side, but also to improve relative permittivity ($\in_r$). If the content of $TiO_2$ is lower than 0.5% by weight, there are cases where $\tau_f$ is not shifted to the positive side beyond -20 ppm/° C. and where $\in_r$ is not improved sufficiently. If the content of $TiO_2$ exceeds 4.5% by weight, $\tau_f$ tends to increase beyond +20 ppm/° C. In particular, the content of $TiO_2$ is preferably from 1.0 to 4.0% by weight because this range of $TiO_2$ content enables $\tau_f$ to be regulated to about -10 to 10 ppm/° C. The more preferred range of $TiO_2$ content is from 1.2 to 3.5% by weight because this $TiO_2$ content range enables $\tau_f$ to be regulated to about -5 to 5 ppm/° C.

The additional amount of $TiO_2$ does not influence $Q_u$. When the content of $TiO_2$ is within the range specified above, $Q_u \times f_0$ can be regulated to 1,800 GHz or higher, in particular a value exceeding 2,500 GHz, without causing problems. In the dielectric material of the second embodiment also, the content of $TiO_2$ is preferably within the range specified above. In the present invention, although $Q_u$ is influenced by the use amount of a Sr compound, sintering temperature, and other factors, $Q_u$ can be regulated so as to result in a value of $Q_u \times f_0$ of usually 2,000 GHz or larger. A value of $Q_u \times f_0$ larger than 2,500 GHz is especially preferred. It is also possible to obtain values of $Q_u \times f_0$ larger than 2,900 GHz, in particular exceeding 3,000 GHz, as demonstrated in Experimental Examples above.

In the fourth embodiment of the present invention, there is provided a dielectric material as described above in the third embodiment, such that the crystallized glass is free of strontium titanate as a crystalline phase and the crystallized glass includes magnesium titanate as another crystalline phase.

It is noted with reference to the third and fourth embodiments that the dielectric materials have a small absolute value of $\tau_f$, a large value of $Q_u \times f_0$, and a high density. Since these dielectric materials can be produced through low-temperature sintering, wiring patterns comprising a conductor, e.g., gold or silver, printed on green tapes from which the dielectric materials are to be obtained, can be sintered simultaneously with the green tapes.

It is noted with respect to the fourth embodiment that when $SrTiO_3$, for example, is used as a Sr compound, crystalline phases consisting of $MgTi_2O_5$, etc. are generated in addition to Sr anorthite. These crystallized phases are present in the crystallized glass. However, the main crystalline phase in the crystallized glass consists of Sr anorthite, and the other crystalline phases exert little adverse influence on dielectric properties. Thus, a dielectric material of the present invention can be obtained that poses no problems in practical use as long as it has a $\tau_f$ of between -20 to +20 ppm/° C. and a value of $Q_u \times f_0$ of 1,800 GHz or larger.

In the fifth embodiment of the present invention, there is provided a dielectric material as described above in the third or fourth embodiments, such that the amount of strontium anorthite is not less than 40 percent by weight based on amount of the crystallized glass.

It is noted with respect to the fifth embodiment that when the content of Sr anorthite is at least 40% by weight based on the amount of the crystallized glass as the parent phase, the dielectric material has a sufficiently improved $Q_u$.

In the sixth embodiment of the present invention, there is provided a dielectric material as described above in embodiment two, where the strontium anorthite is a product of a reaction of a glass frit with a strontium compound.

In the seventh embodiment of the present invention, there is provided a dielectric material as described above in the sixth embodiment, such that the glass frit comprises between 40 and 52 percent by weight $SiO_2$, between 27 and 37 percent by weight $Al_2O_3$, between 11 and 13 percent by weight MgO, between 2 and 8 percent by weight $B_2O_3$, and between 2 and 8 percent by weight CaO, based on the amount of the glass frit.

It is noted with respect to the seventh embodiment above and embodiments eight, fifteen and seventeen below, that the $\tau_f$ and $Q_u$ behavior of the dielectric material obtained varies depending on the particle diameter of the Sr compound used. When a Sr compound having a small particle diameter is used, a large proportion of this compound reacts with a glass frit to yield Sr anorthite, thereby improving $Q_u$. It is noted, however, that when the Sr compound used is a strontium titanate, the $\tau_f$ of the resultant dielectric material is not sufficiently corrected and is below −20 ppm/° C., which is the lower desired limit in the dielectric material. This is due to the $MgTi_2O_5$ yielded simultaneously with Sr anorthite. An appropriate amount of $TiO_2$ is hence used to further shift the $\tau_f$ to the positive side.

On the other hand, when a strontium titanate having a large particle diameter is used, this compound does not sufficiently undergo the reaction yielding Sr anorthite, thus, the amount of the $MgTi_2O_5$ yielded is small. Since the strontium titanate remaining in a large amount functions to correct $\tau_f$ so as to shift it to the positive side, the resultant dielectric material undesirably has a $\tau_f$ value shifted to the positive side beyond +20 ppm/° C., which is the upper desired limit in the dielectric material. In addition, the resultant main crystalline phase is not the Sr anorthite, and the improvement of $Q_u$ is hence insufficient. When a strontium stannate is used as a Sr compound, $MgTi_2O_5$ does not generate, resulting in a different $\tau_f$ behavior. However, the dielectric material obtained using a strontium stannate is excellent in $\tau_f$ and $Q_u \times f_0$, like the dielectric material obtained using a strontium titanate, although slightly reduced in relative permittivity $\in_r$.

In the eighth embodiment of the present invention, there is provided a dielectric material as described above in the seventh embodiment such that the glass frit also includes between 0.1 and 3 percent by weight $ZrO_2$ based on the amount of the glass frit.

It is noted with respect to the eighth embodiment that although various Sr compounds can be used for producing the dielectric materials of embodiments one through three, the resultant crystalline phase containing strontium elements consists substantially of Sr anorthite only (to the extent that a single peak assigned to a crystallized glass of a strontium compound other than Sr anorthite cannot be detected with an X-ray diffraction analysis). This means that the Sr compound used does not remain as the original crystalline phase, but is mostly present as Sr anorthite formed through reaction with a glass frit.

In the ninth embodiment of the present invention, there is provided a dielectric material as described above in embodiment one or two, such that the dielectric material contains no crystalline phase comprising any strontium compound other than strontium anorthite.

It is noted with respect to the ninth embodiment that when the content of Sr anorthite in a dielectric material according to the present invention is from 50 to 85% by weight based on the total amount of all crystalline phases (e.g, strontium anorthite, magnesium titanate, $TiO_2$, anorthite), the dielectric material can have a $Q_u$ value sufficient for practical use. Also, in the dielectric material of this embodiment, the content of Sr anorthite is preferably 40% by weight or higher based on the amount of the crystallized glass as the parent phase because this dielectric material has an even more improved $Q_u$.

In the tenth embodiment of the present invention, there is provided a dielectric material as described above in embodiment four, such that the strontium anorthite includes between 50 and 85 percent by weight based on a total amount of all crystalline phases.

In the eleventh embodiment of the present invention, there is provided a dielectric material as described above in embodiment six, such that the strontium compound is at least one member selected from a group consisting of $SrTiO_3$, $Sr_3Ti_2O_7$, $Sr_2TiO_4$, and $SrSnO_3$.

In the twelfth embodiment of the present invention, there is provided a dielectric material as described above in embodiment six, such that the strontium compound has an average particle diameter of 2 $\mu$m or smaller.

It is noted with respect to the twelfth embodiment that the strontium compound, particularly strontium titanate, more preferably has a particle diameter of 1 $\mu$m or less.

In the thirteenth embodiment of the present invention, there is provided a dielectric material as described above in embodiment six, such that the smaller of the number of moles of silicon of the $SiO_2$ contained in the glass frit and the number of moles of the aluminum of the $Al_2O_3$ contained in the glass frit is more than two times the number of moles of strontium of the strontium compound.

In the fourteenth embodiment of the present invention, there is provided a dielectric material as described above in embodiment one or two, such that the dielectric material has a temperature coefficient of resonance frequency of between −20 and +20 ppm/° C. and a product of an unloaded quality coefficient and the resonance frequency of 1,800 GHz or larger.

In the fifteenth embodiment of the present invention, there is provided a process for producing a dielectric material including the steps of:

(a) mixing between 95.5 and 99.5 percent by weight mixture of a glass frit and a strontium compound with between 0.5 and 4.5 percent by weight $TiO_2$;

(b) compacting the resultant mixture to produce a compact;

(c) sintering the compact at a temperature of between 850 and 1,000° C. in order to densify the compact until the compact attains a water absorption lower than 0.1 percent;

(d) simultaneously reacting the glass frit with the strontium compound to yield strontium anorthite as a main crystalline phase.

It is noted with respect to the fifteenth embodiment that it is possible to synthesize Sr anorthite beforehand and mix it as an inorganic filler with a glass frit together with $TiO_2$. However, the process of this embodiment, in which a glass frit is reacted with a Sr compound in the sintering step to yield Sr anorthite, is industrially advantageous because it requires a fewer steps. Additionally, in producing the dielectric material of the present invention, the sintering can be conducted at a relatively low temperature. A substrate comprising the dielectric material can be produced through sintering simultaneously with other components including a wiring pattern made of a conductive material, e.g., gold, silver, or copper. If the sintering is conducted at a temperature lower than 850° C., the reaction of the glass frit with the Sr compound does not proceed sufficiently and the Sr compound is less apt to change into Sr anorthite. Hence, the resultant dielectric material has too large a positive value of $\tau_f$ and an insufficiently improved $Q_u$. In addition, this dielectric material has not been sufficiently densified and cannot have a water absorption lower than 0.1%.

If the sintering temperature exceeds 1,000° C., there are cases where simultaneous sintering with a conductive material results in a reaction between the dielectric material and the conductive material, the formation of a solid solution of the conductive material in the dielectric material, or the fusion, diffusion, and volatilization of the conductive material. Consequently, use of too high a sintering temperature not only is apt to pose a problem in the formation of a wiring pattern, but also results in the precipitation of other crystals, which may inhibit Sr anorthite from constituting the main crystalline phase.

The sintering temperature is preferably 880° C. or higher, more preferably 900° C. or higher, most preferably 930° C.

or higher. If a sintering temperature lower than 900° C., in particular lower than 880° C., is used, the Sr compound may remain unreacted, and the resultant dielectric material tends to have too large a positive value of $\tau_f$ and an insufficiently improved $Q_u$. When sintering is conducted at temperatures not lower than 930° C., the resultant dielectric materials do not so greatly differ in $\tau_f$ and $Q_u$, probably because the reaction yielding Sr anorthite from the Sr compound ceases at around 930° C. Consequently, the most effective sintering temperature range is between 930 and 950° C.

In the sixteenth embodiment of the present invention, there is provided a process as described above in the fifteenth embodiment, such that the glass frit comprises between 40 and 52 percent by weight $SiO_2$, between 27 and 37 percent by weight $Al_2O_3$, between 11 and 13 percent by weight MgO, between 2 and 8 percent by weight $B_2O_3$, and between 2 and 8 percent by weight CaO, based on the amount of the glass frit.

It is noted with respect to the sixteenth embodiment, as well as embodiments seven and eight described above, that the composition of the glass frit used above is not particularly limited. However, use of a glass frit having a composition described in this embodiment is advantageous in that a relatively low sintering temperature of between 850 and 1,000° C. can be used for sintering and crystallization and a sinter which has been densified to such a degree as to have a water absorption lower than 0.1% can be obtained. The dielectric material thus obtained is a satisfactory product having a transverse rupture strength of 150 MPa or higher, which is sufficient for practical use. Further, even a glass frit having such a composition, or a composition of embodiment seventeen described below, also can be sintered and crystallized using a relatively low sintering temperature to give a sufficiently densified sinter. This dielectric material also is a satisfactory product having a transverse rupture strength of 150 MPa or higher, which is sufficient for practical use. In place of $ZrO_2$, which is thought to function to form crystal nuclei, any other known nucleator(s) may be incorporated into the glass frit.

In the seventeenth embodiment of the present invention, there is provided a process as described above in the sixteenth embodiment, such that the glass frit also includes between 0.1 and 3 percent by weight $ZrO_2$ based on amount of the glass frit.

In the eighteenth embodiment of the present invention, there is provided a process as described above in embodiment fifteen, such that the strontium anorthite is between 50 and 85 percent by weight based on a total amount of all crystalline phases.

In the nineteenth embodiment of the present invention, there is provided a process as described above in embodiment fifteen, such that the strontium compound is at least one member selected from a group consisting of $SrTiO_3$, $Sr_3Ti_2O_7$, $Sr_2TiO_4$, and $SrSnO_3$.

It is noted with respect to the nineteenth embodiment that although various Sr compounds can be used for producing the dielectric materials of the first and second aspect, the resultant crystalline phase containing strontium elements consists substantially of Sr anorthite only (to the extent that a single peak assigned to a crystallized glass of a strontium compound other than Sr anorthite cannot be detected with an X-ray diffraction analysis). This means that the Sr compound used does not remain as the original crystalline phase, but is mostly present as Sr anorthite formed through reaction with a glass frit. This applies in the dielectric material obtained by the process of this embodiment, in which a strontium titanate or a strontium stannate ($SrSnO_3$) is used as a Sr compound. In this dielectric material, the strontium titanate or strontium stannate used does not remain as the original crystalline phase, and no crystalline phase containing strontium element is observed besides Sr anorthite.

Further, the Sr compound is not particularly limited, and any Sr compound can be used as long as it reacts with a glass frit to yield Sr anorthite. Although part of the Sr compound may form a solid solution with the glass phase, substantially all the Sr compound excluding that part preferably changes into Sr anorthite. Preferred examples of the Sr compound are $SrTiO_3$, $Sr_3Ti_2O_7$, $Sr_2TiO_4$, and $SrSnO_3$, which are usually in a powder form. It is preferred to use a Sr compound having a small average particle diameter and a large specific surface area because this Sr compound readily reacts with a glass frit.

In the twentieth embodiment of the present invention, there is provided a process as described above in embodiment fifteen, such that the strontium compound has an average particle diameter of 2 $\mu$m or smaller.

It is noted with respect to the twentieth embodiment that although the Sr compounds are not particularly limited in average particle diameter, it is preferred to use a Sr compound having an average particle diameter of 5 $\mu$m or smaller, more preferably 3 $\mu$m or smaller, most preferably 2 $\mu$m or smaller. If a Sr compound having an average particle diameter exceeding 5 $\mu$m is used, the conversion of the Sr compound into Sr anorthite does not proceed sufficiently, and this tends to result in a dielectric material in which the crystalline phase consisting of the Sr compound used is the main crystalline phase. This dielectric material undesirably has an exceedingly large positive value of $\tau_f$.

In the twenty-first embodiment of the present invention, there is provided a process as described above in embodiment sixteen, such that the smaller of the number of moles of silicon of the $SiO_2$ contained in the glass frit and the number of moles of the aluminum of the $Al_2O_3$ contained in the glass frit is more than two times the number of moles of strontium of the strontium compound.

It is noted with respect to the twenty-first embodiment that the mixing ratio of a glass frit to a Sr compound is not particularly limited. It is, however, preferred to mix the two ingredients in such a proportion that the smaller one of the number of moles of the silicon of the $SiO_2$ contained in the glass frit and the number of moles of the aluminum of the $Al_2O_3$ contained in the glass frit is more than two times the number of moles of the strontium of the Sr compound, because all the Sr compound thus used changes into Sr anorthite in theory. The reason why the term "in theory" was used above is that there are cases where not all the Sr compound added changes into Sr anorthite if sintering conditions or other factors change. Even in this case, the residual Sr compound exerts no particular adverse influence, and it is possible to produce a dielectric material of the present invention which poses no problem in practical use as long as it has a $\tau_f$ of between −20 to +20 ppm/° C. and a value of $Q_u \times f_0$ of 1,800 GHz or larger.

In the twenty-second embodiment of the present invention, there is provided a dielectric material as described above in embodiment one or two, such that the dielectric material is shaped into a substrate, with at least one wiring pattern made of a conductive material on its surface.

Figure 3:
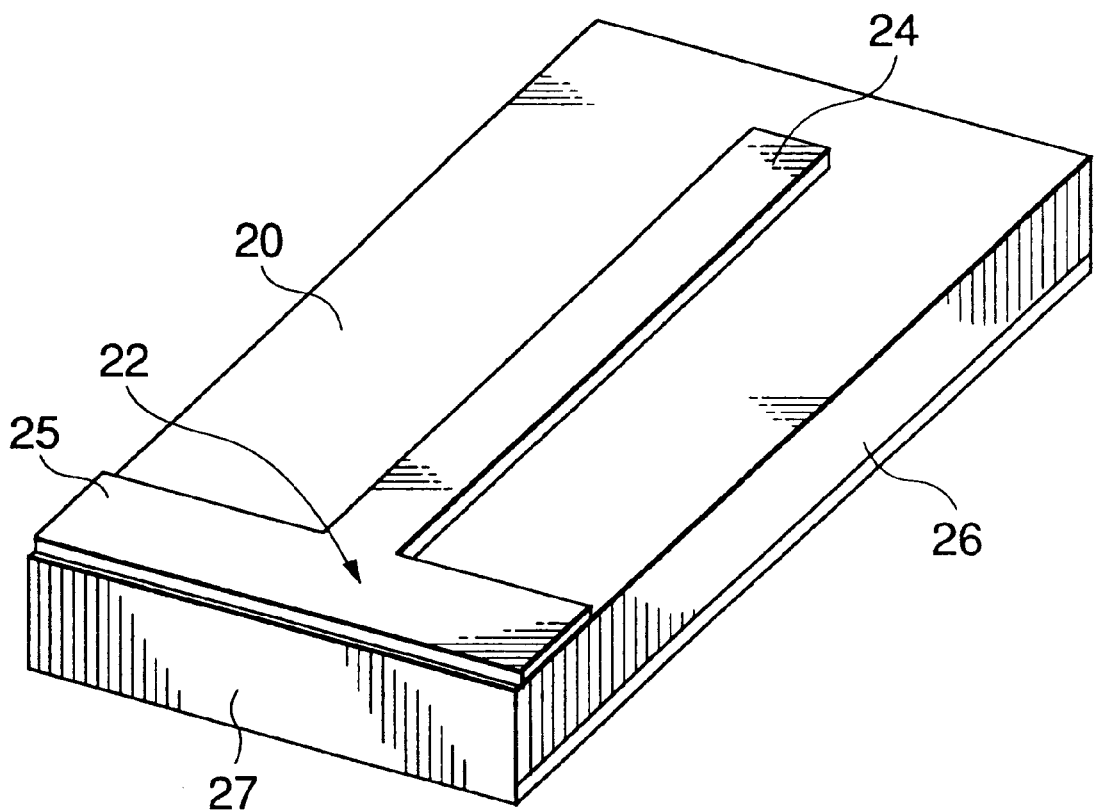
FIG. 3 is an illustration of a dielectric resonator using the material of the present invention.

FIG. 3 shows an illustration of a single layer circuit board configured as a stripline or transmission line resonator device. In this device, a dielectric substrate 20 using the dielectric material for use in the present invention has a conductor 22 formed thereon, with an elongated resonator 24 and a wide apron 25 formed as an integral conductor. The length of the resonator 24 in the structure of FIG. 3 controls the frequency of response of the stripline device. However, as the resonator 24 and apron are formed as a single conductor, the length of the resonator 24 and the point of connection thereof to the conducting apron 25 can be very accurately determined.

The conducting apron portion 25 of the conductor 22 is electrically connected to the ground plane conductor 26 on substrate 20 by a conducting bridge 27 which extends about one end of the substrate 20, as shown in FIG. 3. As the apron portion 25 is relatively wide, the transmission line impedance between this portion and the ground plane 26 is very low so that the entire apron portion is effectively at ground potential. Accordingly, both length of the resonator 24 and the point of connection thereof to ground are accurately determined.

In the twenty-third embodiment of the present invention, there is provided a dielectric material as described above in embodiment one or two, such that the dielectric material is shaped into a plurality of substrates, the substrates are stacked co-planarly to comprise a multilayer circuit board, with at least one wiring pattern made of a conductive material located on surfaces of the substrates.

FIG. 2 shows an illustration of a multilayer circuit board (in this case a seven-layer board) configured as a microwave resonator. The dielectric substrate 1 is used as the material of each substrate. For purposes of explanation, the top layer will be designated as substrate 1a, the substrate that is second from the top will be designated as substrate 1b, and so forth. Interposed between substrate 1b and substrate 1c is a ground layer 3. An electrode 2, interposed between substrate 1a and substrate 1b is used for trimming. An electrode 4, located between substrate 1c and substrate 1d is used as a resonance electrode. Electrodes 4 and 5, located above and below substrate 1d, are input/output electrodes. Electrode 6, located between substrate 1f and substrate 1g is a pole-generating electrode. Electrode 7, located between substrate 1e and substrate 1f, is a coil electrode, and external electrode 8 is positioned around the edges of the structure.

In the twenty-fourth embodiment of the present invention, there is provided a process as described above in embodiment fifteen, additionally including the steps of:

(a) shaping the dielectric material into a substrate, (b) forming at least one wiring pattern made of conductive material on located on at least one surface of the substrates.

An example of such a structure is illustrated in FIG. 5 and described in more detail in the twenty-second embodiment above.

In the twenty-fifth embodiment of the present invention, there is provided a process as described above in embodiment fifteen, additionally including the steps of:

(a) shaping the dielectric material into a plurality of substrates, (b) forming a plurality of wiring patterns made of conductive material on at least one surface of the substrates;

(c) stacking the plurality of substrates co-planarly to comprise a multi-layer circuit board. An example of such a structure is illustrated in FIG. 2 and described in more detail in the twenty-third embodiment above.

It is noted with respect to the embodiments described above that, in particular, the dielectric materials described in embodiments five through fourteen can have a larger value of $Q_u \times f_0$. Furthermore, the process described in the fifteenth embodiment produces a dielectric material combining excellent dielectric properties, where a high density can be produced by preparing a raw material regulated so as to result in the composition described in the third or fourth embodiment, and sintering the raw material at a relatively low temperature simultaneously with a conductive material. In particular, when the starting materials and composition described in embodiments sixteen through twenty-one are used, a dielectric material having even better performances can be obtained.

Moreover, the process described in the twenty-second or twenty-third embodiment may be used to obtain a single layer circuit board or a multilayer circuit board, each having excellent dielectric properties, and each usable in various electronic devices, particularly as a resonators, filters, or other devices for use in the microwave range.

While the invention has been described in detail and with reference to specific embodiments thereof, it will be apparent to one skilled in the art that various changes and modifications can be made therein without departing from the spirit and scope thereof.

What is claimed is:

1. A dielectric material comprising between 95.5 and 99.5 percent by weight crystallized glass, the crystallized glass comprising strontium anorthite as a main crystalline phase; and the dielectric material further comprising between 0.5 and 4.5 percent by weight $TiO_2$.

2. The dielectric material of claim 1, wherein the crystallized glass is free of strontium titanate as a crystalline phase; and the crystallized glass further comprising magnesium titanate as another crystalline phase.

3. The dielectric material of either claim 1 or 2, wherein an amount of the strontium anorthite is not less than 40 percent by weight based on amount of the crystallized glass.

4. A dielectric material comprising a glass ceramic, the glass ceramic comprising strontium anorthite as a main crystalline phase and $TiO_2$ as another crystalline phase, wherein the strontium anorthite is a product of a reaction of a glass frit with a strontium compound, the strontium compound having at least one member selected from the group consisting $Sr_3Ti_2O_7$, $Sr_2TiO_4$, $SrSnO_3$ and $SrTiO_3$, wherein the glass frit comprises between 40 and 52 percent by weight $SiO_2$, between 27 and 37 percent by weight $Al_2O_3$, between 11 and 13 percent by weight MgO, between 2 and 8 percent by weight $B_2O_3$, and between 2 and 8 percent by weight CaO, the percentages based on amount of the glass frit.

5. The dielectric material of claim 4, wherein the glass frit further comprises between 0.1 and 3 percent by weight $ZrO_2$ based on amount of the glass frit.

6. The dielectric material of claim 3, wherein the dielectric material contains no crystalline phase comprising any strontium compound other than strontium anorthite.

7. The dielectric material of claim 2, wherein the strontium anorthite comprises between 50 and 85 percent by weight based on a total amount of all crystalline phases.

8. The dielectric material of claim 1, wherein the strontium compound has an average particle diameter of 2 $\mu$m or smaller.

9. The dielectric material of claim 4, wherein the smaller of a number of moles of silicon of the $SiO_2$ contained in the glass frit and a number of moles of the aluminum of the $Al_2O_3$ contained in the glass frit is more than two times the number of moles of strontium of the strontium compound.

10. The dielectric material of claim 1, wherein the dielectric material has a temperature coefficient of resonance frequency of between −20 and +20 ppm/° C., the dielectric material further having a product of an unloaded quality coefficient and the resonance frequency of 1,800 GHz or larger.

11. The dielectric material of claim 1, wherein the dielectric material is shaped into a substrate comprising at least one surface;

the substrate further having at least one wiring pattern made of a conductive material, the at least one wiring pattern made of a conductive material located on the at least one surface.

12. The dielectric material of claim 1, wherein the dielectric material is shaped into a plurality of substrates, the plurality of substrates stacked co-planarly to comprise a multilayer circuit board;

the substrates further comprising surfaces;

the multilayer circuit board further comprising at least one wiring pattern made of a conductive material, the wiring patterns located on the surfaces of the substrates.

13. The dielectric material of claim 4, wherein the glass frit comprises between 2 and 7.9 percent by weight $B_2O_3$, the percentages based on amount of the glass frit.

14. The dielectric material of claim 4, wherein the glass frit comprises between 45.1 and 52 percent by weight $SiO_2$, the percentages based on amount of the glass frit.

15. The dielectric material of claim 4, wherein the one member of the strontium compound is selected from the group consisting of $Sr_3Ti_2O_7$ and $SrTiO_3$.

16. A dielectric material comprising a glass ceramic, the glass ceramic comprising strontium anorthite as a main crystalline phase and $TiO_2$ as another crystalline phase, wherein the strontium anorthite is a product of a reaction of a glass frit with a strontium compound, the strontium compound having at least one member selected from the group consisting of $Sr_3Ti_2O_7$, $Sr_2TiO_4$, $SrSnO_3$ and $SrTiO_3$, and wherein the glass frit comprises between 40 and 52 percent by weight $SiO_2$, between 27 and 37 percent by weight $Al_2O_3$, between 11 and 13 percent by weight MgO, between 2 and 8 percent by weight $B_2O_3$, and between 2 and 4.9 percent by weight CaO, the percentages based on amount of the glass frit.

17. The dielectric material of claim 16, wherein the one member of the strontium compound is selected from the group consisting of $Sr_3Ti_2O_7$ and $SrTiO_3$.

18. A process for producing a dielectric material comprising:

material between 95.5 and 99.5 percent by weight comprising a glass frit and a strontium compound with between 0.5 and 4.5 percent by weight $TiO_2$, the mixing producing a resultant mixture;

compacting the resultant mixture to produce a compact;

burning the compact at a temperature of between 850 and 1,000° C. in order to densify the compact until the compact attains a water absorption lower than 0.1 percent; and simultaneously reacting the glass frit with the strontium compound to yield strontium anorthite as a main crystalline phase.

19. The process of claim 18, wherein the glass frit comprises between 40 and 52 percent by weight $SiO_2$, between 27 and 37 percent by weight $Al_2O_3$, between 11 and 13 percent by weight MgO, between 2 and 8 percent by weight $B_2O_3$, and between 2 and 8 percent by weight CaO, the percentages based on amount of the glass frit.

20. The process of claim 19, wherein the glass frit further comprises between 0.1 and 3 percent by weight $ZrO_2$ based on amount of the glass frit.

21. The process of claim 18, wherein the strontium anorthite comprises between 50 and 85 percent weight based on a total amount of all crystalline phases.

22. The process of claim 18, wherein the strontium compound is atleast one member selected from a group consisting of $SrTiO_3$, $Sr_3Ti_2O_7$, $Sr_2TiO_4$, and $SrSnO_3$.

23. The process of claim 18, wherein the strontium compound has an average particle diameter of 2 $\mu$m or smaller.

24. The process of claim 19, wherein the smaller of the number of moles of silicon of the $SiO_2$ contained in the glass frit and the number of moles of the aluminum of the $Al_2O_3$ contained in the glass frit is more than two times the number of moles of strontium of the strontium compound.

25. The process of claim 18, wherein the process further comprises the steps of:

shaping the dielectric material into a substrate comprising at least one surface; and forming at least one wiring pattern made of conductive material on the at least one surface.

26. The process of claim 18, wherein the process further comprises the steps of:

shaping the dielectric material into a plurality of substrates, each of the plurality of substrates having at least one surface;

forming a plurality of wiring patterns made of conductive material on at least one of the at least one surface; and stacking the plurality of substrates co-planarly to comprise a multi-layer circuit board.

* * * * *

UNITED STATES PATENT AND TRADEMARK OFFICE
CERTIFICATE OF CORRECTION

PATENT NO. : 6,121,174
DATED : September 19, 2000
INVENTOR(S) : Yokoi et al.

Page 1 of 1

It is certified that error appears in the above-identified patent and that said Letters Patent is hereby corrected as shown below:

<u>Claim 22,</u>
Line 2, change "atleast" to -- at least; --.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*